United States Patent
Dong et al.

(10) Patent No.: US 10,096,971 B2
(45) Date of Patent: Oct. 9, 2018

(54) HYBRID SEMICONDUCTOR LASERS

(71) Applicants: Alcatel Lucent USA, Inc., Murray Hill, NJ (US); ALCATEL-LUCENT CANADA, INC., Ottawa (CA)

(72) Inventors: Po Dong, Morganville, NJ (US); Young-Kai Chen, Berkeley Heights, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 1375 days.

(21) Appl. No.: 14/315,970

(22) Filed: Jun. 26, 2014

(65) Prior Publication Data

US 2017/0214216 A1    Jul. 27, 2017

(51) Int. Cl.
| | |
|---|---|
| H01S 5/00 | (2006.01) |
| H01S 5/026 | (2006.01) |
| H01S 5/10 | (2006.01) |
| H01S 5/02 | (2006.01) |
| H01S 3/063 | (2006.01) |
| H01S 5/30 | (2006.01) |

(52) U.S. Cl.
CPC ............ H01S 5/026 (2013.01); H01S 3/0637 (2013.01); H01S 5/021 (2013.01); H01S 5/0215 (2013.01); H01S 5/1014 (2013.01); H01S 5/3013 (2013.01)

(58) Field of Classification Search
CPC ...... H01S 5/1014; H01S 5/021; H01S 5/0215; H01S 5/3013; H01S 5/026; H01S 3/0637
See application file for complete search history.

(56) References Cited

U.S. PATENT DOCUMENTS

| | | | |
|---|---|---|---|
| 6,455,398 B1 * | 9/2002 | Fonstad, Jr. | G02B 6/1245 |
| | | | 257/E21.088 |
| 8,428,404 B1 | 4/2013 | Shubin et al. | |
| 8,488,923 B2 | 7/2013 | Na | |
| 8,853,745 B2 * | 10/2014 | Tabatabaie | H01L 27/0617 |
| | | | 257/213 |
| 9,052,449 B2 | 6/2015 | Sagawa et al. | |
| 9,134,478 B2 | 9/2015 | Park et al. | |

(Continued)

FOREIGN PATENT DOCUMENTS

| | | | | |
|---|---|---|---|---|
| JP | 2015179783 | * | 8/2015 | ............... H01S 5/22 |
| WO | 2012098471 | | 7/2012 | |

OTHER PUBLICATIONS

"Final Office Action dated May 6, 2016 for Related U.S. Appl. No. 14/579,424".

(Continued)

*Primary Examiner* — Kinam Park
(74) *Attorney, Agent, or Firm* — Kramer & Amado, P.C.

(57) ABSTRACT

Various exemplary embodiments relate to an apparatus including: a first substrate including a planar dielectric layer on a semiconducting layer, and a silicon layer located directly on a planar surface of the dielectric layer, adjacent first and second segments of the silicon layer being optically end-coupled, the first segment being thicker than the second segment; and a second substrate including a III-V semiconductor layer segment on a top surface thereof, the first and second substrates being bonded together such that the III-V semiconductor layer segment is in direct contact with a portion of the first segment of the silicon layer.

23 Claims, 3 Drawing Sheets

(56) References Cited

U.S. PATENT DOCUMENTS

| | | | |
|---|---|---|---|
| 2009/0116523 A1* | 5/2009 | Leem | G02B 6/12004 372/44.01 |
| 2009/0245298 A1 | 10/2009 | Sysak et al. | |
| 2015/0249318 A1 | 9/2015 | Fattal et al. | |
| 2015/0270684 A1* | 9/2015 | Suzuki | H01S 5/1237 372/45.012 |
| 2015/0378100 A1 | 12/2015 | Dong | |

OTHER PUBLICATIONS

"International Search Report and Written Opinion dated Nov. 25, 2015 for International Application No. PCT/IB2015/001053".
"Po Dong et al., U.S. Appl. No. 62/017,481, filed Jun. 26, 2014".
Camacho-Aguilera, Rodolfo E., An electrically pumped germanium laser, Opt. Express 20 (2012), 11316-11320.
Cerutti, L. et al., GaSb-based laser, monolithically grown on silicon substrate, emitting at 1.55 µm at room temperature, IEEE Photon. Tech. Lett. 22 (2010), 553-555.
Dong, Po , Monolithic Silicon Lasers, filed Jun. 26, 2014, 1-30.
Duan, G-.H. et al., 10 Gb/s Integrated Tunable Hybrid III-V/Si Laser and Siicon Mach-Zehnder Modulator, ECOC Technical Digest 2012 Tu.4.E.2.pdf, 3 pages.
Duan, G.-H. et al., III-V on Silicon Transmitters, OFC/NFOEC Technical Digest 2012 OSA, 3 pages.
Fang, Alexander W. et al., Electrically pumped hybrid AlGaInAs-silicon evanescent laser, Optics Express 9203, vol. 14, No. 20, 8 pages, Sep. 13, 2006.
Liu, et al., "Tensile-strained, n-type Ge as a gain medium for monolithic laser integration on Si", Optics Express, vol. 15, No. 18, pp. 11272-11277, Sep. 3, 2007.
Wikipedia, "List of Semiconductor Materials", https://en.wikipedia.org/wiki/List_of_semiconductor_materials.

* cited by examiner

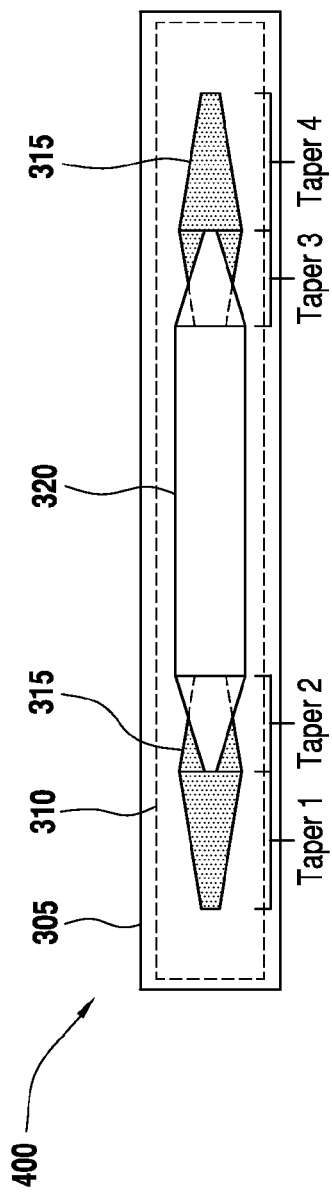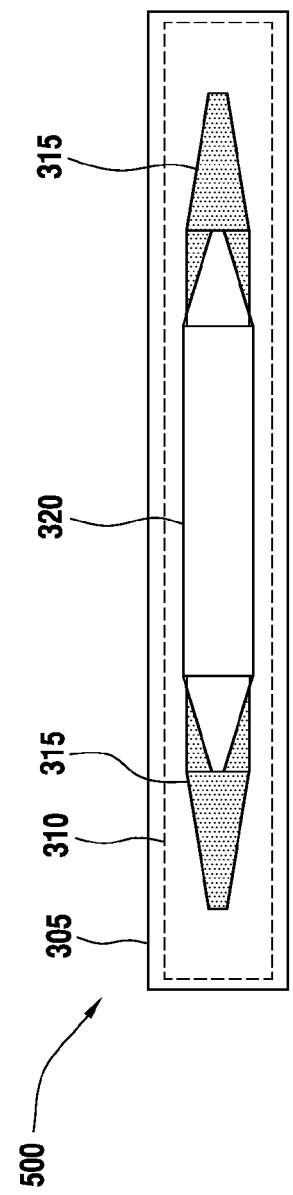

HYBRID SEMICONDUCTOR LASERS

CROSS-REFERENCE TO RELATED APPLICATIONS

This application hereby incorporates by reference, in its entirety, "MONOLITHIC SILICON LASERS", 62/017,481 which is being concurrently filed on Jun. 26, 2014, by Po Dong.

TECHNICAL FIELD

Various exemplary embodiments disclosed herein relate generally to hybrid semiconductor optical devices and lasers.

BACKGROUND

Silicon based optical-electronic integration may offer low-cost solutions for optical communications and interconnects. Further, silicon may enable fabricating low-cost, compact circuits that integrate photonic and microelectronic elements. Silicon optical-electronic integration may address a wide range of applications from short distance data communication to long haul optical transmission. laser. Unfortunately, some devices may be difficult to make in integrated silicon-based chips.

SUMMARY

A brief summary of various exemplary embodiments is presented below. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

Various exemplary embodiments relate to an apparatus including: a first substrate including a planar dielectric layer on a semiconducting layer, and a silicon layer located directly on a planar surface of the dielectric layer, adjacent first and second segments of the silicon layer being optically end-coupled, the first segment being thicker than the second segment; and a second substrate including a III-V semiconductor layer segment on a top surface thereof, the first and second substrates being bonded together such that the III-V semiconductor layer segment is in direct contact with a portion of the first segment of the silicon layer.

Various embodiments are described wherein the second segment of the silicon layer having a thickness that varies by less than 10 nanometers.

Various embodiments are described further comprising a second dielectric layer located on the first dielectric layer and laterally surrounding the first segment, the second dielectric layer and the first segment having upper surfaces of the same height at interfaces therebetween.

Various embodiments are described wherein substrate including a first silicon layer is a silicon on insulator (SOI) substrate.

Various embodiments are described wherein the apparatus includes a laser whose optical gain medium includes, at least, part of the III-V semiconductor layer segment.

Various embodiments are described wherein the apparatus includes an optical modulator or a photodetector including, at least, part of the III-V semiconductor layer segment.

Various embodiments are described wherein the first segment has a lateral taper region at each end thereof.

Various embodiments are described wherein the III-V semiconductor layer segment includes a lateral taper at each end thereof.

Various embodiments are described wherein the first segment has third and fourth tapers overlapping the lateral tapers of the III-V layer segment.

Various embodiments are described wherein the thickness of the first segment is greater than about 380 nm.

Various embodiments are described wherein the thickness of the first segment is between about 380 nm and 420 nm.

Various embodiments are described wherein the thickness of first segment is between about 100 nm to 350 nm.

Various embodiments are described wherein the thickness of second segment is between about 200 nm to 240 nm.

Further various exemplary embodiments relate to a method of manufacturing a hybrid optical semiconductor device, including: forming an opening in a first dielectric layer to expose a part of a first silicon layer segment, the first silicon layer segment being located on a planar surface of a second dielectric in a first substrate; forming a second silicon layer segment in the opening such that exposed surfaces of the second silicon layer segment and the second dielectric layer have about the same distance from the planar surface; and bonding a second substrate to the first substrate such that a III-V semiconductor layer segment of the second substrate is in direct contact with the exposed surface of the second silicon layer segment.

Various embodiments are described further comprising polishing the first substrate to cause the exposed surfaces of the second silicon layer segment and the second dielectric layer to have a same distance from the planar surface.

Various embodiments are described wherein the first substrate is a silicon on isolator (SOI) substrate.

Various embodiments are described wherein the first silicon layer segment has a height over the planar surface that varies by less than 10 nanometers in regions within one micrometer of the second silicon layer segment.

Various embodiments are described wherein the III-V semiconductor layer segment is a part of the optical gain medium of a laser.

Various embodiments are described wherein III-V semiconductor layer segment is a part of one of an optical modulator and a photo-detector.

Various embodiments are described wherein the second silicon layer segment has first and second taper regions at first and second ends thereof.

Various embodiments are described wherein the III-V semiconductor layer segment includes a first laterally tapered segment at a first end thereof and second lateral taper segment at a second end thereof.

Various embodiments are described wherein the second silicon layer segment has third and fourth lateral taper regions overlapping the first and second tapered segments of the III-V layer segment.

BRIEF DESCRIPTION OF THE DRAWINGS

In order to better understand various exemplary embodiments, reference is made to the accompanying drawings, wherein:

FIG. 4 illustrates another embodiment of the hybrid optical-electronic device; and FIG. 5 illustrates another embodiment of the hybrid optical-electronic device.

Figure 1A:
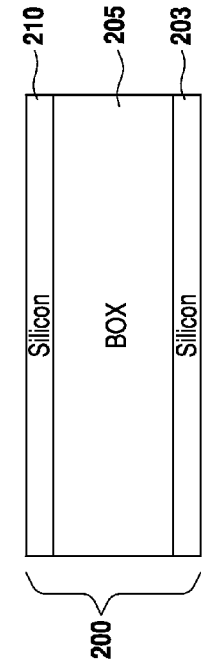
FIGS. 1a-1c illustrate various structures formed while forming a device that integrates a III-V semiconductor layer with a silicon waveguide.

In the Figures, relative dimensions of some features may be exaggerated to more clearly show one or more of the structures being illustrated therein. To facilitate understanding, identical reference numerals have been used in the Figures and the text to designate elements having substantially the same or similar structure or substantially the same or similar function.

Herein, various embodiments are described more fully by the Figures and the Detailed Description. Nevertheless, the inventions may be embodied in various forms and are not limited to the specific embodiments that are described in the Figures and Detailed Description.

DETAILED DESCRIPTION

The description and drawings merely illustrate the principles of various ones of the inventions. It will thus be appreciated that those skilled in the art will be able to devise various arrangements that, although not explicitly described or shown herein, embody the principles of the inventions and are included within its scope. Furthermore, all examples recited herein are principally intended expressly to be only for pedagogical purposes to aid the reader in understanding the principles of the inventions and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. As used herein, the terms "context" and "context object" will be understood to be synonymous, unless otherwise indicated.

Silicon photonics is a technology, where optical components use silicon as an optical medium, e.g., using silicon-on-insulator (SOI) substrates. Silicon photonics may exploit methods, such as for example, complementary metal-oxide-semiconductor (CMOS) fabrication methods. These techniques may offer high yield and low cost photonic integrated circuits which may find applications from short reach interconnects to long-haul coherent optical transmission systems. Silicon photonics can monolithically integrate electro-optic modulators, photo-detectors, optical couplers, optical power splitters/combiners, optical filters, wavelength (de)multiplexing filters, arrayed waveguide gratings, micro rings, variable optical attenuators, variable optical couplers, polarization beam splitters/combiners, polarization rotators, etc. However, fabricating an efficient laser with silicon photonics has been difficult, because silicon is not an efficient light-emitting material. The fabrication if a laser on silicon is using wafer bonding a III-V semiconductor layer to a silicon-based substrate so that the III-V material provides the optical gain, and portions of the silicon provide parts of the laser cavity. In this so-called hybrid laser, the light is preferably efficiently coupled between III-V semiconductor and silicon layers. However, efficient light coupling between silicon waveguide cores and III-V gain layers typically requires a silicon thickness more than 400 nm, while the typical silicon thickness for silicon photonic integrated circuits are less, .e.g., around 220 nm. This thickness mismatch induces significant optical and/or physical coupling challenges. Some embodiments, which are described below, propose an integration structure between optical gain materials such as III-V semiconductors and silicon photonic circuits.

Figure 1B:
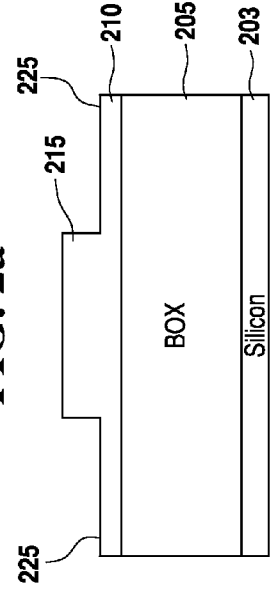
Figure 1C:
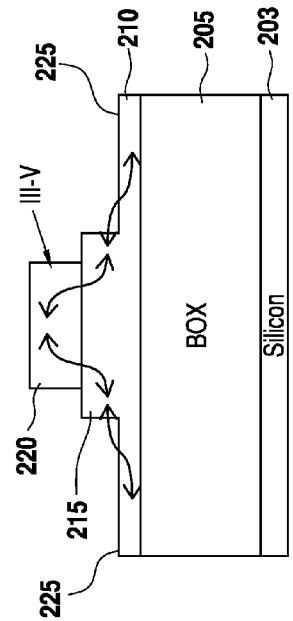

FIGS. 1a-1c a sequence of structures formed by a method for integrating a III-V semiconductor device layer with a substrate having one or more silicon waveguide core segments thereon. FIGS. 1a-1c are cross-sectional views along the length of the silicon waveguide core segments. It is noted that the gain III-V layer used to implement a laser may typically have an effective index of 3. Accordingly, to efficiently couple light between the top III-V layer and a bottom silicon waveguide segment, the silicon waveguide segment preferably should often have an effective index of around 3. Such an effective index matching may require that silicon waveguide segment have a thickness larger than about 400 nm. In many silicon photonic circuits, the silicon waveguides are much thinner, for example, often are about 220 nm thick. One way to solve this effective index matching problem is to increase the starting thickness of the silicon waveguide layer(s) to about 400 nm. FIG. 1a illustrates an SOI substrate 100 with a silicon substrate 103, a buried oxide (BOX) layer 105, and a silicon layer 110 that is approximately 400 nm thick or greater. FIG. 1b illustrates the silicon layer 110 after being etched down to a thickness of about 220 nm in the non-laser regions and region(s) of transition between laser and other circuits to form a thin waveguide region 125 leaving a thick waveguide region 115 that is about 400 nm thick. FIG. 1c next illustrates a III-V laser 120 including a III-V waveguide layer bonded to the thick silicon waveguide region 115. The laser radiation from the III-V waveguide layer 120 may now couple to the thick silicon waveguide region 115 first and then from the thick silicon waveguide region 115 to the thin silicon waveguide 125. For efficient coupling, further tapers may at transitions between the different waveguide regions. Various horizontal or vertical taper structures may help avoid abrupt junction transitions in FIG. 1, which are not shown in this cross section. The etching method, however, can produce roughness on the top surface of thin silicon waveguide 125 as well as variations in the thickness of the thin silicon waveguide 125. This roughness will increase optical losses in the thin silicon waveguide due to scattering at such rough surfaces.

Figure 2A:
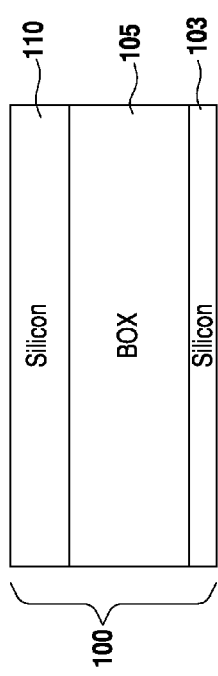
FIGS. 2a-2c illustrate structures formed by various steps of an embodiment of a method of forming the hybrid optical-electronic device.
Figure 2B:
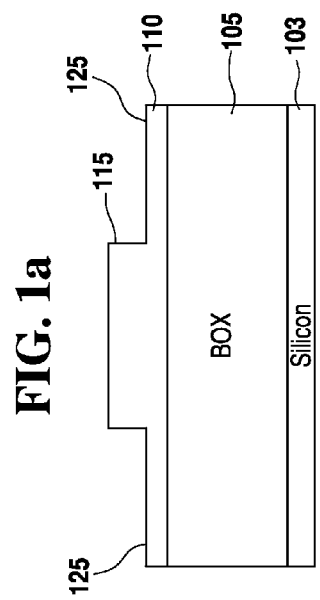
Figure 2C:
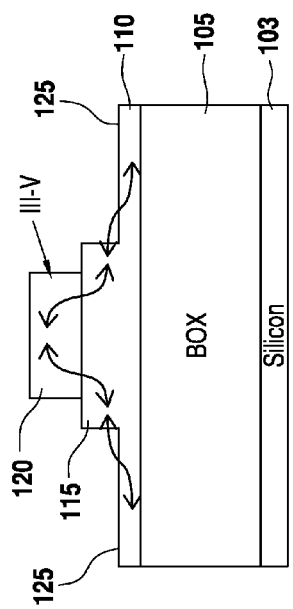

FIGS. 2a-2c illustrate structures formed at various steps of a method of forming a hybrid optical-electronic device according to an embodiment. Instead of etching down the thick silicon as shown in FIGS. 1a-1c, as shown in FIG. 2a, the method starts with a silicon-on-insulator (SOI) wafer 200 with a silicon substrate 203, a BOX layer 205, and a thin silicon layer 210, e.g., with a thickness of about 220 nm, or other thickness less than about 400 nm. FIG. 2b illustrates a structure resulting from a selective deposition of silicon to form a thick waveguide segment 215. The resulting thickness may be about 400 nm or greater to allow for efficient optical coupling with a III-V waveguide layer to be subsequently added. FIG. 2c illustrates bonding of the III-V waveguide layer 220 to the top of the thick waveguide segment 215. Transition tapers may be used between the various transition segments of the optical waveguides For example, such transition tapers may assist the coupling between III-V waveguide layer 220 and thick silicon waveguide segment 215 and also may assists the optical coupling between the thick silicon waveguide segment 215 and thin silicon waveguide segments 225.

FIGS. 3a-e illustrate cross-sectional and top views structures formed at various steps of an embodiment of a method of fabricating a hybrid optical-electronic device. The method may begin with a SOI with a thin top silicon layer on a BOX layer 305 and silicon substrate 303. Portions of the thin top silicon layer may be etched leaving a silicon layer that will form segments of a silicon waveguide 310 after fabrication is complete. Additionally, photonic circuits may be also fabricated in other lateral portions of the thin top silicon layer that connect with the silicon waveguide 310. The silicon waveguide 310 may be any type of waveguide including a ridge or channel waveguide. The photonic circuits may include optical devices as described above. Further electrical circuits may also be integrated into other lateral portions of the thin top silicon layer of the SOI. While this embodiment uses an SOI substrate, other types of silicon substrates may be used as well. The optical and/or electric devices formed in, on, and/or from the thin top silicon layer of the SOI may be manufactured using typical semiconductor manufacturing processes, such as for example CMOS processes. The thin top silicon layer may be, e.g., about 220 nm thick, or may have, e.g., a thickness in the range of about 100 nm to 350 nm.

Figure 3:
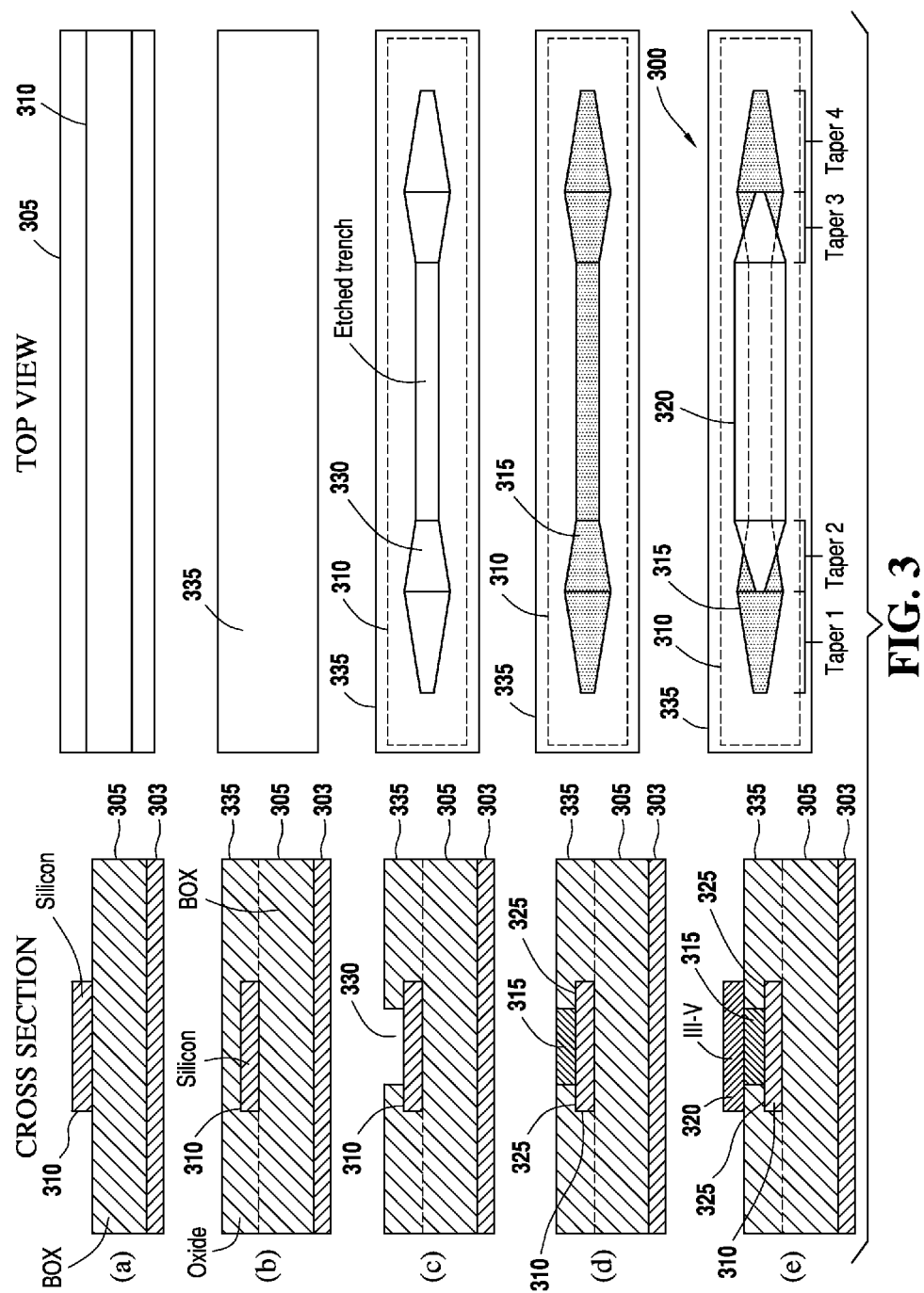
FIGS. 3a-e illustrate cross-sectional and top views of various structures formed by steps of an embodiment of a method of fabricating a hybrid optical-electronic device.

FIG. 3b illustrates an intermediate structure formed by a step of the method. The structure includes an insulator or dielectric layer such as a silicon oxide layer 335. The insulator or dielectric layer may be made of another dielectric, for example other types of oxides, silicon nitride, or other optical cladding material. The silicon oxide layer 335 may be deposited over and around the silicon waveguide 310. This silicon oxide layer 335 may be of the same or a different material as the BOX layer 305. Again, this layer may be formed and processed using standard semiconductor manufacturing processes.

FIG. 3c illustrates an intermediate structure formed by a step of the method which includes forming an opening 330 in the oxide layer 335. This step may include etching the oxide layer using typical semiconductor manufacturing processes. This opening 330 may be further used as a mask to control the formation of an additional silicon layer at a subsequent step. The opening 330 may include taper structures as shown to allow for improved coupling of light between the different waveguide structures.

FIG. 3d illustrates the intermediate structure produced by a step of the method that includes forming an additional silicon layer 315 in the opening 330. This additional silicon layer 315 may be formed, e.g., by epitaxial growth of silicon inside the opening 330 or, e.g., by deposition of polysilicon or amorphous silicon by standard deposition techniques such as plasma-enhanced chemical vapor deposition (PECVD). This step may include performing any known silicon deposition method for producing a layer of silicon. The formation of this silicon layer 315 may also result in silicon deposited on the oxide layer 335. Then, this step of the method may include, e.g., polishing the added silicon layer 315 and the oxide layer 335, for example, using chemical-mechanical polishing (CMP). This polishing may result, e.g., in the grown silicon only residing inside the opening 330. This step of the method typically provides a smooth top surface on the additional silicon layer 315 which reduces the loss of light passing this additional silicon layer 315 as well as improving the physical and optical coupling characteristics with the III-V waveguide by providing a flat surface. This may result in a polished surface e.g., with a substantially continuous joint upper surface including the upper surface of the additional silicon layer 315 and the upper surface of the oxide layer 335. This polished surface may result in a thickness of the polished layers that varies less than about 10 nanometers. It is noted that these techniques could also be applied to substrates with some curvature, where the various layers would conform to the desired curvature. The thickness of the additional layer may be, e.g., about 180 nm resulting in a total thickness of about 400 nm. The total thicknesses may be, e.g., greater than about 380 nm or may be, e.g., between about 380 nm and about 420 nm. This additional layer 315 along with its underlying silicon layer will form a thick silicon waveguide in the final structure that facilitates the transmission of light from a III-V layer to the final thin silicon waveguide 325. The thin silicon waveguide 325 is the portion of the silicon waveguide 310 that extends out from under the additional silicon layer 315.

FIG. 3e illustrates the structure resulting for the step of bonding a chip having the III-V semiconductor layer 320, to the top surface of the structure formed in the previous step of the method, for example, to produce a hybrid laser cavity. The bonding step may use any conventional method for bonding portions of the surfaces of 2 chips together. The bonding step may position the III-V semiconductor layer 320 in direct and fixed contact with the silicon layer of the other chip.

In FIG. 3e four taper regions are shown of the lateral layout of an exemplary structure that may be produced by the bonding step. Taper 1 region shows a width taper in the additional silicon layer 315 that couples light between thin silicon waveguide and thick silicon waveguide. The taper 2 region, which may include both tapers on thick silicon waveguide and the III-V waveguide, may also couple light between thick silicon waveguide and the III-V waveguide. The taper 3 region may couple light between the III-V waveguide and the thick silicon waveguide, while the taper 4 region couples light between the thick silicon waveguide and the thin silicon waveguide.

FIG. 4 illustrates another embodiment of the hybrid optical-electronic device. The hybrid optical-electronic device 400 is similar to the device 300 of FIGS. 3a-3e except for a difference in additional layer 315. In the device of FIG. 4, the additional layer 315 in device 400 does not extend between the Taper regions 2 and 3. Instead the tapers in the additional layer 315 that overlap the tapers of the III-V waveguide come to stops. Each stop is shown as a flat tip on the taper.

FIG. 5 illustrates another embodiment of the hybrid optical-electronic device. The hybrid optical-electronic device 500 is similar to the device 300 of FIGS. 3a-3e except for a difference in additional layer 315. The additional layer 315 in device 400 does not have tapers like the tapers in regions 2 and 3 of the device 300. Instead the additional layer 315 maintains its width as it extends between the Taper regions at the end of the additional layer 315.

The various tapers illustrated in the different embodiments provide examples of the type of taper geometries that may be used. The tapers may come to a pointed, rounded or other shaped tip rather than a flat tip as shown. Further, the sides of the taper are shown as straight lines, but may be other shapes that result in the tapering of the width. Also, there may be tapers in the thickness of the waveguides that are coupled to one another. Manufacturing such a taper is more complex than tapering the width of the waveguides, but it may be done if needed to address certain coupling or other requirements.

In the examples above the III-V semiconductor device is described as a laser. There are other types of devices that may be beneficially implemented using III-V semiconductor materials. Examples include modulators, photo-detectors, etc. Various combinations of III-V materials may be used for the III-V semiconductor device including for example, GaAs, InP, InGaAs, etc. Also various types of optical devices may be implemented in the silicon layer including, for example, electro-optic modulators, optical amplifiers, photo-detectors, optical couplers, optical power splitters/combiners, optical filters, wavelength (de)multiplexing filters, arrayed waveguide gratings, micro rings, variable optical attenuators, variable optical couplers, polarization beam splitters/combiners, polarization rotators, etc.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. An apparatus comprising:
   a first substrate including a planar dielectric layer on a semiconducting layer, and a silicon layer located directly on a planar surface of the dielectric layer; and
   a III-V semiconductor layer in direct contact with a first segment of the silicon layer to form a hybrid optical waveguide core; and
   wherein a successive second segment of the silicon layer forms a silicon optical waveguide core optically end-coupled to and adjacent to an end of the hybrid optical waveguide core, the silicon layer being thicker in the hybrid waveguide core than in the silicon waveguide core; and
   wherein the second segment of the silicon layer having a thickness that varies by less than 10 nanometers in the silicon waveguide core.

2. The apparatus of claim 1, further comprising a second dielectric layer located on the first dielectric layer and laterally surrounding the first segment, the second dielectric layer and the first segment having upper surfaces of the same height at interfaces there between.

3. The apparatus of claim 1, wherein the substrate including a first silicon layer is a silicon on insulator (SOI) substrate.

4. The apparatus of claim 1, wherein the apparatus includes a laser whose optical gain medium includes, at least, part of the III-V semiconductor layer segment.

5. The apparatus of claim 1, wherein the apparatus includes an optical modulator or a photodetector including, at least, part of the III-V semiconductor layer segment.

6. The apparatus of claim 1, wherein the first segment has a lateral taper region at each end thereof.

7. The apparatus of claim 6, wherein the III-V semiconductor layer segment includes a lateral taper at each end thereof.

8. The apparatus of claim 7, wherein the first segment has third and fourth tapers overlapping the lateral tapers of the III-V lateral segment.

9. The apparatus of claim 1, wherein the thickness of the first segment is greater than about 380 nm.

10. The apparatus of claim 1, wherein the thickness of the first segment is between about 380 nm and 420 nm.

11. The apparatus of claim 1, wherein the thickness of the first segment is between about 100 nm and 350 nm.

12. The apparatus of claim 1, wherein the thickness of the second segment is between about 200 nm and 240 nm.

13. A method of manufacturing a hybrid optical semiconductor device, comprising:
   forming an opening in a first dielectric layer to expose a part of a first silicon layer segment of a first semiconductor layer, the first silicon layer being located on a planar surface of a second dielectric on a planar surface of a first substrate;
   forming a second silicon layer on the first silicon layer in the opening; and
   bonding a second substrate to the first substrate such that a III-V semiconductor layer segment of the second substrate is in direct contact with an exposed surface of the second silicon layer; and
   wherein the bonding produces a hybrid optical waveguide core including the first silicon layer segment such that the hybrid optical waveguide core is optically end connected to an adjacent end of a silicon optical waveguide core of a remaining segment of the silicon layer.

14. The method of claim 13, further comprising polishing the first substrate to cause the exposed surfaces of the first silicon layer segment and the second dielectric layer to have a same distance from the planar surface.

15. The method of claim 13, wherein the first substrate is a silicon on insulator (SOI) substrate.

16. The method of claim 13, wherein the first silicon layer segment has a height over the planar surface that varies by less than 10 nanometers in regions within one micrometer of the second silicon layer segment.

17. The method of claim 13, wherein the III-V semiconductor layer segment is a part of the optical gain medium of a laser.

18. The method of claim 13, wherein the III-V semiconductor layer segment is a part of one of an optical modulator and a photo-detector.

19. The method of claim 16, wherein the second silicon layer segment has first and second taper regions at first and second ends thereof.

20. The method of claim 19, wherein the III-V semiconductor layer segment includes a first laterally tapered segment at a first end thereof and second lateral taper segment at a second end thereof.

21. The method of claim 20, wherein the second silicon layer has third and fourth lateral taper regions overlapping the first and second tapered segments of the III-V layered segment.

22. The apparatus of claim 1, wherein a third segment of the silicon layer forms another silicon optical waveguide core optically end-coupled to and adjacent to another end of the hybrid optical waveguide core, the silicon layer being thicker in the hybrid optical waveguide core than in the another silicon optical waveguide core.

23. The method of claim 13, wherein the forming a second silicon layer includes performing an epitaxial growth of the second silicon layer.

* * * * *